United States Patent
Mazor et al.

(10) Patent No.: US 9,390,984 B2
(45) Date of Patent: Jul. 12, 2016

(54) X-RAY INSPECTION OF BUMPS ON A SEMICONDUCTOR SUBSTRATE

(71) Applicant: JORDAN VALLEY SEMICONDUCTORS LTD., Migdal HaEmek (IL)

(72) Inventors: Isaac Mazor, Haifa (IL); Alex Tokar, Haifa (IL); Boris Yokhin, Nazareth Illit (IL); Matthew Wormington, Littleton, CO (US)

(73) Assignee: BRUKER JV ISRAEL LTD., Migdal HaEmek (IL)

( * ) Notice: Subject to any disclaimer, the term of this patent is extended or adjusted under 35 U.S.C. 154(b) by 258 days.

(21) Appl. No.: 13/647,408

(22) Filed: Oct. 9, 2012

(65) Prior Publication Data
US 2013/0089178 A1    Apr. 11, 2013

Related U.S. Application Data

(60) Provisional application No. 61/545,599, filed on Oct. 11, 2011.

(51) Int. Cl.
*H01L 21/44* (2006.01)
*H01L 21/66* (2006.01)

(52) U.S. Cl.
CPC ........................................ *H01L 22/12* (2013.01)

(58) Field of Classification Search
CPC .................................................. H01L 21/44
USPC ................................................................ 378/44
See application file for complete search history.

(56) References Cited

U.S. PATENT DOCUMENTS

| | | | |
|---|---|---|---|
| 3,256,431 A | 6/1966 | Frazer | |
| 3,581,087 A | 5/1971 | Brinkerhoff | |
| 3,919,548 A | 11/1975 | Porter | |
| 3,980,568 A | 9/1976 | Pitchford et al. | |
| 3,984,680 A * | 10/1976 | Smith | 378/34 |

(Continued)

FOREIGN PATENT DOCUMENTS

| JP | 6186344 A | 7/1994 |
|---|---|---|
| JP | 2006283585 A | 10/1994 |

(Continued)

OTHER PUBLICATIONS

Singer, "Copper CMP: Taking aim at Dishing", Semiconductor International (www.reed-electronics.com/semiconductor/), 4 pages, Oct. 1, 2004.

(Continued)

*Primary Examiner* — Phillip A Johnston
(74) *Attorney, Agent, or Firm* — D. Kligler IP Services Ltd.

(57) ABSTRACT

A method for inspection includes irradiating, with a focused beam, a feature formed on a semiconductor wafer, the feature including a volume containing a first material and a cap made of a second material, different from the first material, that is formed over the volume. One or more detectors positioned at different angles relative to the feature are used to detect X-ray fluorescent photons that are emitted by the first material in response to the irradiating beam and pass through the cap before striking the detectors. Signals output by the one or more detectors at the different angles in response to the detected photons are processed in order to assess a quality of the cap.

14 Claims, 4 Drawing Sheets

(56) References Cited

U.S. PATENT DOCUMENTS

| | | |
|---|---|---|
| 4,048,496 A | 9/1977 | Albert |
| 4,085,329 A | 4/1978 | McCoy et al. |
| 4,169,228 A | 9/1979 | Briska et al. |
| 4,446,568 A | 5/1984 | Williams et al. |
| 4,551,905 A | 11/1985 | Chao et al. |
| 4,590,603 A | 5/1986 | Relihan et al. |
| 4,710,259 A | 12/1987 | Howe et al. |
| 4,718,075 A | 1/1988 | Horn |
| 4,725,963 A | 2/1988 | Taylor et al. |
| 4,847,882 A | 7/1989 | Knoth et al. |
| 4,852,135 A | 7/1989 | Anisovich et al. |
| 4,916,720 A | 4/1990 | Yamamoto et al. |
| 4,989,226 A | 1/1991 | Woodbury et al. |
| 5,151,588 A | 9/1992 | Kiri et al. |
| 5,192,869 A | 3/1993 | Kumakhov |
| 5,365,563 A | 11/1994 | Kira et al. |
| 5,425,066 A | 6/1995 | Takahashi et al. |
| 5,481,109 A | 1/1996 | Ninomiya et al. |
| 5,497,008 A | 3/1996 | Kumakhov |
| 5,574,284 A | 11/1996 | Farr |
| 5,619,548 A | 4/1997 | Koppel |
| 5,740,226 A | 4/1998 | Komiya et al. |
| 5,742,658 A | 4/1998 | Tiffin et al. |
| 5,778,039 A | 7/1998 | Hossain et al. |
| 5,877,498 A | 3/1999 | Sugimoto et al. |
| 5,893,758 A | 4/1999 | Sandhu et al. |
| 5,900,645 A | 5/1999 | Yamada |
| 5,909,276 A | 6/1999 | Kinney et al. |
| 5,923,720 A | 7/1999 | Barton et al. |
| 5,937,026 A | 8/1999 | Satoh |
| 5,937,027 A | 8/1999 | Thevenin et al. |
| 5,949,847 A | 9/1999 | Terada et al. |
| 5,963,329 A | 10/1999 | Conrad et al. |
| 6,001,736 A | 12/1999 | Kondo et al. |
| 6,040,095 A | 3/2000 | Enichen et al. |
| 6,041,095 A | 3/2000 | Yokhin |
| 6,041,098 A | 3/2000 | Touryanski et al. |
| 6,108,398 A | 8/2000 | Mazor et al. |
| 6,173,036 B1 | 1/2001 | Hossain et al. |
| 6,192,103 B1 | 2/2001 | Wormington et al. |
| 6,226,347 B1 | 5/2001 | Golenhofen |
| 6,226,349 B1 | 5/2001 | Schuster et al. |
| 6,266,389 B1 | 7/2001 | Murayama et al. |
| 6,345,086 B1 | 2/2002 | Ferranolino et al. |
| 6,351,516 B1* | 2/2002 | Mazor ............... G01N 23/223 257/E21.53 |
| 6,381,303 B1 | 4/2002 | Vu et al. |
| 6,389,102 B2 | 5/2002 | Mazor et al. |
| 6,453,002 B1 | 9/2002 | Mazor et al. |
| 6,453,006 B1 | 9/2002 | Koppel et al. |
| 6,507,634 B1 | 1/2003 | Koppel et al. |
| 6,512,814 B2 | 1/2003 | Yokhin et al. |
| 6,556,652 B1 | 4/2003 | Mazor et al. |
| 6,635,872 B2* | 10/2003 | Davidson ............. G01N 23/225 250/306 |
| 6,639,968 B2 | 10/2003 | Yokhin et al. |
| 6,643,354 B2 | 11/2003 | Koppel et al. |
| 6,680,996 B2 | 1/2004 | Yokhin et al. |
| 6,704,661 B1 | 3/2004 | Opsal et al. |
| 6,711,232 B1 | 3/2004 | Janik |
| 6,744,850 B2 | 6/2004 | Fanton et al. |
| 6,744,950 B2 | 6/2004 | Aleksoff |
| 6,750,952 B2 | 6/2004 | Grodnensky et al. |
| 6,754,304 B1 | 6/2004 | Kumakhov |
| 6,754,305 B1 | 6/2004 | Rosencwaig et al. |
| 6,771,735 B2 | 8/2004 | Janik et al. |
| 6,810,105 B2 | 10/2004 | Nasser-Ghodsi et al. |
| 6,823,043 B2 | 11/2004 | Fewster et al. |
| 6,879,051 B1 | 4/2005 | Singh et al. |
| 6,890,575 B2 | 5/2005 | Beauregard et al. |
| 6,891,627 B1* | 5/2005 | Levy ............... G01N 21/211 257/E21.53 |
| 6,895,075 B2 | 5/2005 | Yokhin et al. |
| 6,947,520 B2 | 9/2005 | Yokhin et al. |
| 6,977,986 B1 | 12/2005 | Beanland et al. |
| 7,023,954 B2 | 4/2006 | Rafaeli et al. |
| 7,062,013 B2 | 6/2006 | Berman et al. |
| 7,068,753 B2 | 6/2006 | Berman et al. |
| 7,071,007 B2 | 7/2006 | Tseng et al. |
| 7,103,142 B1* | 9/2006 | Agnihotri ............. G01N 23/20 378/82 |
| 7,110,491 B2 | 9/2006 | Mazor et al. |
| 7,120,228 B2 | 10/2006 | Yokhin et al. |
| 7,130,376 B2 | 10/2006 | Berman et al. |
| 7,183,547 B2* | 2/2007 | Yun et al. ............ 250/310 |
| 7,245,695 B2 | 7/2007 | Mazor et al. |
| 7,551,719 B2 | 6/2009 | Yokhin et al. |
| 7,600,916 B2 | 10/2009 | Yokhin et al. |
| 7,649,978 B2 | 1/2010 | Mazor et al. |
| 7,653,174 B2* | 1/2010 | Mazor ............... G01N 23/223 378/50 |
| 7,804,934 B2 | 9/2010 | Agnihotri et al. |
| 7,968,444 B2* | 6/2011 | Luo et al. ............ 438/597 |
| 2001/0028699 A1 | 10/2001 | Iwasaki |
| 2001/0043668 A1 | 11/2001 | Hayashi et al. |
| 2002/0097837 A1 | 7/2002 | Fanton et al. |
| 2002/0110218 A1 | 8/2002 | Koppel et al. |
| 2003/0012337 A1 | 1/2003 | Fewster et al. |
| 2003/0128809 A1 | 7/2003 | Umezawa et al. |
| 2003/0157559 A1 | 8/2003 | Omote et al. |
| 2004/0052330 A1 | 3/2004 | Koppel et al. |
| 2004/0109531 A1 | 6/2004 | Yokhin et al. |
| 2004/0131151 A1 | 7/2004 | Berman et al. |
| 2004/0156474 A1 | 8/2004 | Yokhin et al. |
| 2004/0218717 A1 | 11/2004 | Koppel et al. |
| 2004/0267490 A1 | 12/2004 | Opsal et al. |
| 2005/0282300 A1* | 12/2005 | Yun ............... G01N 23/2252 438/14 |
| 2006/0062350 A1 | 3/2006 | Yokhin et al. |
| 2006/0227931 A1 | 10/2006 | Mazor et al. |
| 2006/0274886 A1 | 12/2006 | Mazor et al. |
| 2008/0021665 A1 | 1/2008 | Vaughnn |
| 2008/0049895 A1 | 2/2008 | Agnihotri et al. |
| 2008/0095309 A1 | 4/2008 | Puusaari et al. |
| 2008/0159475 A1 | 7/2008 | Mazor et al. |

FOREIGN PATENT DOCUMENTS

| | | |
|---|---|---|
| JP | 07019844 A | 1/1995 |
| JP | 7128259 | 5/1995 |
| JP | 09308339 A | 12/1997 |
| JP | 10048398 A | 2/1998 |
| JP | 10318949 A | 12/1998 |
| JP | 2004003959 A | 1/2004 |
| JP | 2004151004 A | 5/2004 |
| WO | 92/08235 A1 | 5/1992 |

OTHER PUBLICATIONS

Reed Electronics Group, Semiconductor International, "Webcast Equipment Auction" (www.reed-electronics.com/semiconductor/), 2 pages, Dec. 15, 2005.

Dane et al., "Application of Genetic Algorithms for Characterization of Thin Layered Materials by Glancing Incidence X-Ray Reflectometry", Physica B 253, pp. 254-268, Feb. 26, 1998.

Kozaczek et al., "X-Ray Diffraction Metrology for 200 mm Process Qualification and Stability Assessment", Advanced Metallization Conference, Montreal, Canada, 6 pages, Oct. 8-11, 2001.

Powell et al., "X-Ray Diffraction and Reflectivity Characterization of SiGe Superlattice Structures", Semiconductor Science and Technology Journal, vol. 7, No. 5, pp. 627-631, United Kingdom, 1992.

Neissendorfer et al., "The Energy—Dispersive Reflectometer / Diffractometer at BESSY-I", Measurement Science and Technology Journal, vol. 10, No. 5, pp. 354-361, year 1999.

Ulyanenkov, "Introduction to High Resolution X-Ray Diffraction", Workshop on X-Ray Characterization to Thin Layers, 50 pages, Uckley, May 21-23, 2003.

Huang et al., "Characterization of Single and Multiple-Layer Films by X-Ray Reflectometry", Advances in X-Ray Analysis, vol. 35, pp. 137-142, New York, USA, 1992.

EX-6500 Advanced EDXRF Spectrometer Manufactures by Jordan Valley Semiconductors, 2 pages, year 2000.

(56) References Cited

OTHER PUBLICATIONS

Lengeler, "X-Ray Reflection, a New Tool for Investigating Layered Structures and Interfaces", Advances in X-Ray Analysis, Plenum Press, vol. 35, pp. 127-135, New York, USA, 1992.
Lankosz et al., "Research in Quantitative X-Ray Fluorescence Microanalysis of Patterned This Films", Advances in X-Ray Analysis, vol. 43, pp. 497-503, year 1999.
Parrill et al., "GISAXS—Glancing Incidence Small Angle X-Ray Scattering", Journal de Physique IV, supplement to Journal de Physique I, vol. 3, pp. 411-417, Dec. 1993.
Bowen et al., "X-Ray Metrology by Diffraction and Reflectivity", 2000 International Conference on Characterization and Metrology for ULSI Technology, NIST, Gaithersburg, Maryland, USA, pp. 570-579, Jun. 26-29, 2000.
Naudon et al., "New Apparatus for Grazing X-Ray Reflectometry in the Angle—Resolved Dispersive Mode", Journal of Applied Crystallography, vol. 22, pp. 460-464, year 1989.
X-Ray Optical Systems, Inc., "Monolithic Polycapillary Lens Information", Albany, USA, 1 page, Dec. 29, 1998.
Markowicz et al., "Quantification in XRF Analysis of Intermediate-Thickness Samples", Handbook of X-Ray Spectrometry, 2nd edition, chapter 6, pp. 408-431, Antwerp, Belgium, CRC Press 2001.
U.S. Appl. No. 11/018,352, Office Action dated Feb. 8, 2006.
U.S. Appl. No. 11/889,337, Office Action dated Jul. 24, 2008.
U.S. Appl. No. 11/018,352, Office Action dated Oct. 24, 2005.
U.S. Appl. No. 11/487,433, Office Action dated May 29, 2008.
U.S. Appl. No. 12/003,215, Office Action dated Apr. 1, 2009.
U.S. Appl. No. 11/103,071, Office Action dated Oct. 5, 2006.
U.S. Appl. No. 09/028,588, Office Action dated Jun. 4, 1999.
Jones et al., "Small Angle X-Ray Scattering for sub-100 nm Pattern Characterization", Journal of Applied Physics, vol. 83, No. 19, pp. 4059-4061, Nov. 10, 2003.
Hu et al., "Small Angle X-Ray Scattering Metrology for Sidewall Angle and Cross Section of Nanometer Scale Line Gratings", Journal of Applied Physics, vol. 96, No. 4, pp. 1983-1987, Aug. 15, 2004.
Wu et al., "Small Angle Neutron Scattering Measurements of Nanoscale Lithographic Features", Polymer Preprints, vol. 42, No. 1, pp. 265-266, year 2001.

Kojima et al., "Structural Characterization of Thin Films by X-Ray Reflectivity", Rigaku Journal, vol. 16, No. 2, pp. 31-41, year 1999.
X-Ray Optical Systems, Inc., "Micro X-Ray Fluorescence with Focusing Polycapillary Optics", Application Note 102, 2 pages, USA, Jun. 12, 2002.
Guerault, "Specular Reflectivity and Off-Specular Scattering: Tools for Roughness Investigation", Institute Voor Kern-en Stralingsfysica, 15 pages, Dec. 15, 2000.
Wiener et al., "Characterization of Titanium Nitride Layers by Grazing—Emission X-Ray Fluorescence Spectrometry", Applied Surface Science, vol. 125, pp. 129-136, Elsevier Science B.V., year 1999.
Hayashi et al., "Refracted X-Rays Propagating Near the Surface Under Grazing Incidence Condition", Spectrochimica Acta, Part B 54, pp. 227-230, year 1999.
Di-Fonzo et al., "Non-Destructive Determination of Local Strain with 100-Nanometre Spatial Resolution", Letters to Nature, vol. 403, pp. 638-640, Feb. 10, 2000.
Agnihotri, U.S. Appl. No. 11/610,174, "Accurate Measurement of Layer Dimensions using XRF", filed Dec. 13, 2006 (abandoned).
Japan Patent Application 2007-340602, Office Action dated Apr. 24, 2012.
Leng et al., "Simultaneous Measurement of Six Layers in a Silicon on Insulator Film Stack using Spectrophotometry and Beam Profile Reflectometry", Journal of Applied Physics, vol. 81, No. 8, pp. 3570-3578, Apr. 15, 1997.
Boer, "Calculation of X-Ray Fluorescence Intensities from Bulk and Multilayer Samples", X-Ray Spectrometry, vol. 19, pp. 145-154, year 1990.
Mantler, "X-ray fluorescence analysis of multiple-layer films", Analytica chimica acta, vol. 188, pp. 25-35, year 1986.
Patterson, "Transforming mobile electronics with copper pillar interconnect", Advancing microelectronics, vol. 39, No. 3, pp. 18-24, May/Jun. 2012.
Beckhoff et al, "Handbook of Practical X-Ray Fluorescence Analysis", Springer-Verlag, Berlin, Heidelberg, pp. 1-30, year 2006.
U.S. Appl. No. 14/222,635 Office Action dated Dec. 7, 2015.

\* cited by examiner

X-RAY INSPECTION OF BUMPS ON A SEMICONDUCTOR SUBSTRATE

CROSS-REFERENCE TO RELATED APPLICATIONS

This application claims the benefit of U.S. Provisional Patent Application 61/545,599, filed Oct. 11, 2011, which is incorporated herein by reference.

FIELD OF THE INVENTION

The present invention relates generally to inspection and testing of patterned semiconductor wafers in production, and particularly to X-ray inspection systems and methods.

BACKGROUND

X-ray fluorescence (XRF) measurement, and specifically X-ray microfluorescence (i.e., X-ray fluorescence using focused excitation beams of small diameter, such as less than 100 µm), is gaining increasing attention as a method for testing semiconductor wafers. XRF itself is a well-known technique for determining the elemental composition of a sample. XRF analyzers generally include an X-ray source, which irradiates the sample with sufficient energy to excite X-ray fluorescence from the elements of interest within the sample, and an X-ray detector, for detecting the X-ray fluorescence emitted by the sample in response to the irradiation. Each element in the sample emits X-ray fluorescence in energy bands that are characteristic of the element. The detected X-ray fluorescence is analyzed to find the energies or, equivalently, the wavelengths of the detected photons, and the qualitative and/or quantitative composition of the sample is determined based on this analysis.

U.S. Pat. No. 6,108,398, for example, whose disclosure is incorporated herein by reference, describes an XRF analyzer and a method for analyzing a sample. The analyzer includes an X-ray beam generator, which generates an X-ray beam incident at a spot on the sample and creates a plurality of fluorescent X-ray photons. An array of semiconductor detectors is arranged around the spot so as to capture the fluorescent X-ray photons. The analyzer produces electrical pulses suitable for analysis of the sample.

The use of X-ray microfluorescence for testing semiconductor wafers is described in U.S. Pat. No. 6,351,516, whose disclosure is incorporated herein by reference. This patent describes a non-destructive method for testing the deposition and/or the removal of a material within a recess on the surface of a sample. An excitation beam is directed onto a region of the sample in a vicinity of the recess, and an intensity of X-ray fluorescence emitted from the region is measured. A quantity of the material that is deposited within the recess is determined responsively to the measured intensity.

SUMMARY

Embodiments of the present invention that are described hereinbelow provide improved methods and apparatus for inspection of microscopic structures using X-ray fluorescence.

There is therefore provided, in accordance with an embodiment of the present invention, a method for inspection, which includes irradiating, with a focused beam, a feature formed on a semiconductor wafer, the feature including a volume containing a first material and a cap made of a second material, different from the first material, that is formed over the volume. One or more detectors, positioned at different angles relative to the feature, are used to detect X-ray fluorescent photons that are emitted by the first material in response to the irradiating beam and pass through the cap before striking the detectors. Signals output by the one or more detectors at the different angles in response to the detected photons are processed in order to assess a quality of the cap.

In disclosed embodiments, processing the signals includes measuring an attenuation by the second material of the X-rays emitted in a characteristic fluorescence line of the first material and may include estimating a size of the cap responsively to the attenuation.

Additionally or alternatively, processing the signals includes measuring a difference between the signals output by the detectors at the different angles in order to identify an inhomogeneity in the cap. Measuring the difference may include identifying a void in the cap responsively to the difference between the signals output by first and second detectors positioned at opposing azimuthal angles relative to the feature.

In a disclosed embodiment, the method includes detecting, using an array of the detectors, further X-rays emitted from the cap in response to the irradiating beam in a characteristic fluorescence line of the second material, and assessing a misalignment of the array relative to the feature based on a difference between the X-rays in the characteristic fluorescence line detected at the different angles. Detecting the X-ray fluorescent photons includes correcting for the misalignment in detection of the X-ray fluorescent photons.

In one embodiment, the volume includes a pillar containing a first metallic element, and the cap includes a second metallic element, configured to serve as an electrical contact for the pillar.

There is also provided, in accordance with an embodiment of the present invention, inspection apparatus, including an X-ray source, which is configured to irradiate, with a focused beam, a feature formed on a semiconductor wafer, the feature including a volume containing a first material and a cap made of a second material, different from the first material, that is formed over the volume. The apparatus includes an array of detectors, which are positioned at different angles relative to the feature, and are configured to detect X-ray fluorescent photons that are emitted by the first material in response to the irradiating beam and pass through the cap before striking the detectors. Processing circuitry is coupled to process signals output by the detectors in response to the detected photons in order to assess a quality of the cap.

The present invention will be more fully understood from the following detailed description of the embodiments thereof, taken together with the drawings in which:

DETAILED DESCRIPTION OF EMBODIMENTS

In production of microelectronic devices in silicon wafers, a common sort of feature comprises a cap containing one material, formed over a volume containing another, different material. For example, tin (Sn) bumps are sometimes formed on the device surface to serve as electrical contacts. In a common configuration, the Sn bump is formed as a cap on the top of a volume of copper (Cu), referred to as a "pillar," such as a via that has been filled with Cu in an earlier stage of production. For good, reliable electrical contact, it is important that the bump be a defect-free solid. In some cases, however, process variations may result in defects, such as voids, typically containing gas or some other contaminant, within the Sn bumps.

Embodiments of the present invention that are described hereinbelow use X-ray fluorescence to detect the presence of voids in individual caps on the wafer surface, such as Sn bumps over Cu pillars. For this purpose, an irradiating beam, typically a focused X-ray beam, is directed through the bump and excites X-ray fluorescence in the Cu pillar. The resulting intensity of one or more of the Cu X-ray emission lines is measured by one or more detectors at various different angles around the Sn bump (at different azimuths and possibly different elevations, as well). The signals output by the detectors at the different angles, in response to the detected photons, are processed in order to assess the quality of the bump.

Normally, absorption of the Cu emission in the Sn bump attenuates the emission, and this attenuation is uniform as a function of angle. When a void occurs, however, there will be relatively less attenuation of the Cu emission in the direction that passes through the void, and the measured emission will thus be stronger in this direction than in others. Measurement of this directional variation of the Cu emission (advantageously, using multiple X-ray detectors), for example, gives an indication of the presence of voids in the Sn.

This directional measurement may be inaccurate, however, if the X-ray excitation beam is not precisely centered on the Sn bump. To ensure proper centering, the intensity of one or more characteristic Sn X-ray fluorescence lines may be measured simultaneously with the Cu fluorescence (even using the same detectors for Cu and Sn emission lines). When the X-ray beam is properly centered, the Sn emission should be uniform as a function of angle, whereas de-centering will result in unequal Sn emission signals at different angles. Measurement of the simultaneous Sn emission may be used to correct for misalignment errors in the measurement of Cu emission, either by precisely setting the alignment of the X-ray beam on each bump or by adjusting the measurement results, for example.

Although the disclosed embodiments relate, by way of example, specifically to Sn bumps on Cu pillars, the principles of the present invention may similarly be applied to other combinations of materials and cap/volume geometries. Furthermore, the techniques described below for detecting and measuring voids may similarly be applied, mutatis mutandis, in detecting inclusions in the cap of any foreign material with different X-ray absorption from the cap material.

Figure 1:
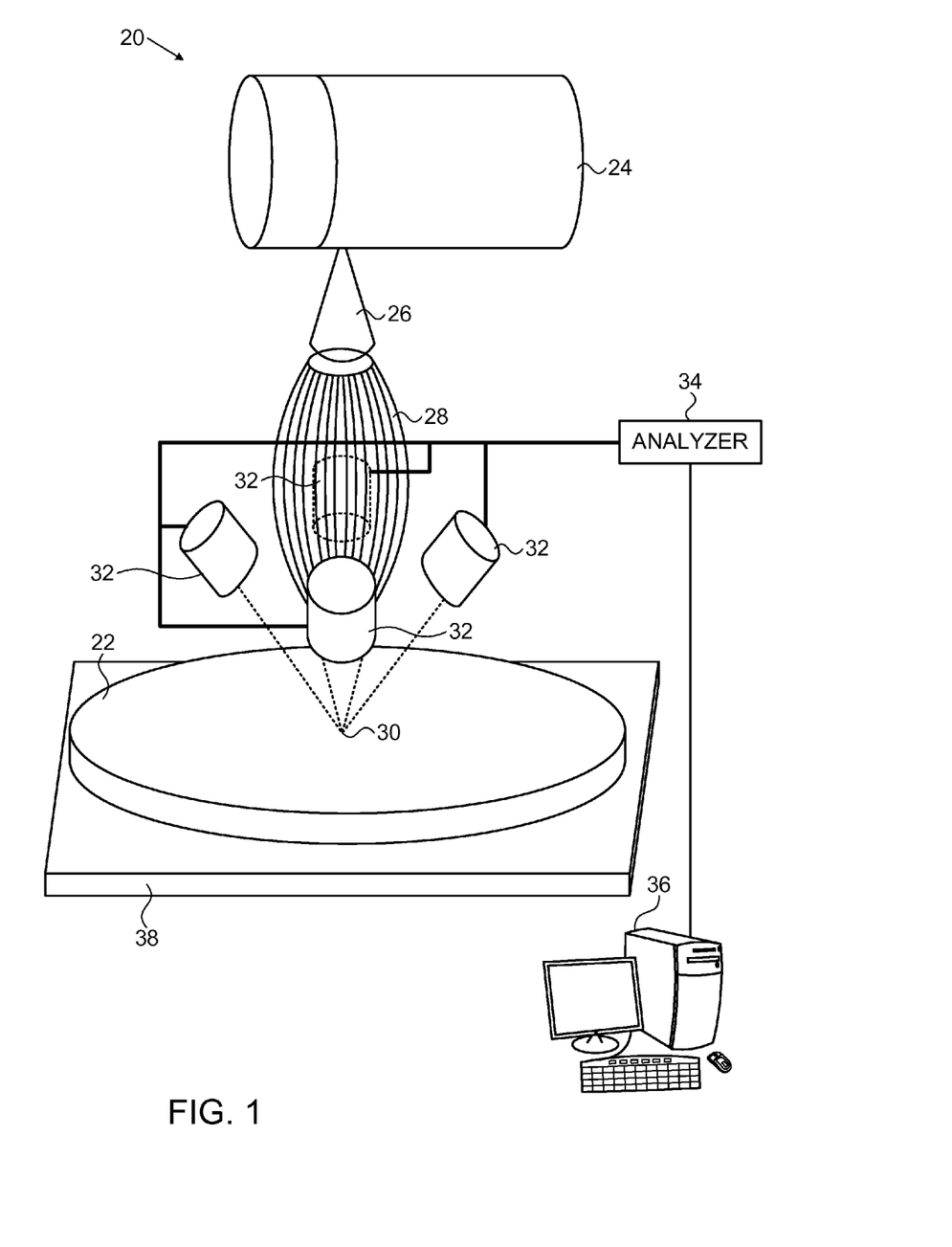
FIG. 1 is a schematic illustration of a system for X-ray microfluorescence measurement, in accordance with an embodiment of the present invention.

FIG. 1 is a schematic illustration of an X-ray microfluorescence analysis system 20, in accordance with an embodiment of the present invention. Aspects of system 20 are described in detail in the above-mentioned U.S. Pat. No. 6,108,398. Analyzer 20 is arranged to examine a semiconductor wafer 22 (or another sample), in order to identify faults in structures formed on the wafer during the fabrication process, using methods described hereinbelow.

System 20 typically comprises an excitation source, such as an X-ray tube 24, driven by a high-voltage power supply, as is known in the art. The X-ray tube emits an X-ray beam 26 having a suitable energy range and power flux into X-ray optics 28. The optics may comprise a polycapillary array, for example. Optics 28 focus the X-ray beam onto a small region 30, typically a spot on the order of 10-20 μm in diameter, on the surface of wafer 22. The irradiated region emits fluorescent X-rays, which are captured by an array of detectors 32 arranged around region 30 and angled toward it. The detectors may comprise any suitable type of X-ray detectors, such as Si(Li) (lithium-drifted silicon) detectors or silicon drift detectors (SDDs), which generate pulses whose amplitude is proportional to the energy of the incident X-ray photons. In response to the captured photons, detectors 32 generate electrical signals, which are conveyed to a signal analyzer 34.

Alternatively, other types of X-ray fluorescence analyzers known in the art, comprising any suitable excitation source, power source, focusing optics and detection system, may be used for implementing the methods described herein.

Signal analyzer 34 typically comprises an energy-dispersive pulse processor, as is known in the art. The output of analyzer 34 is coupled to a digital processor 36, which computes an intensity spectrum of the X-ray photons captured by the detectors. (For the sake of simplicity, signal analyzer 34 and processor 36 are referred to collectively simply as "processing circuitry.") Alternatively, signal analyzer 34 may comprise a wavelength-dispersive detection and processing system. Processor 36 typically comprises a general-purpose computer, which performs the digital processing functions of system 20 under the control of suitable software. The software may be downloaded to the processor in electronic form, over a network, for example, or it may alternatively be provided on tangible media, such as optical, magnetic or electronic memory media.

As shown in FIG. 1, system 20 is used to examine region 30 on wafer 22. In one embodiment, the sample is mounted on a movable platform, such as a motion stage 38, so as to enable the wafer to be translated and/or rotated with respect to the X-ray beam and detectors. Alternatively, the wafer is mounted on a suitable stationary fixture while tube 24, optics 28 and detectors 32 are moved, so that the X-ray beam scans the wafer.

System 20 may be further configured to capture and process X-rays scattered from wafer 22 by other mechanisms, such as reflection, diffraction, and/or small-angle scattering. Multi-function systems of this sort are described, for example, in U.S. Pat. Nos. 6,381,303 and 6,895,075 and 7,551,719, whose disclosures are incorporated herein by reference.

Figure 2:
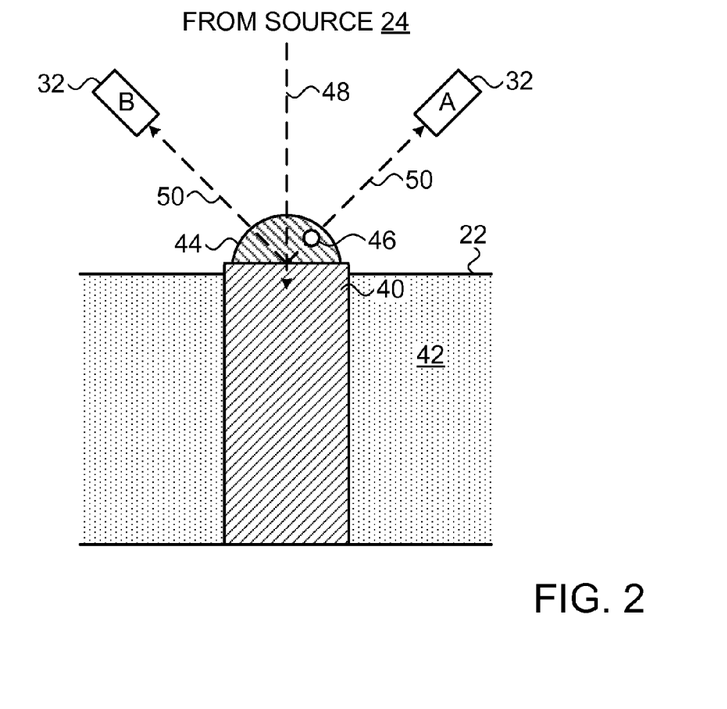
FIG. 2 is a schematic sectional view of a bump on a semiconductor wafer, under inspection by an array of XRF detectors in accordance with an embodiment of the present invention.
Figure 3:
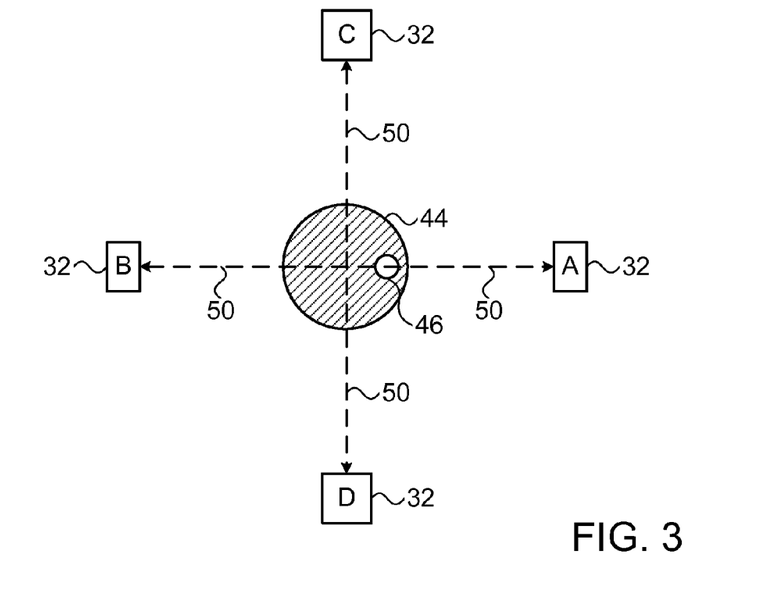
FIG. 3 is a schematic top view of the bump and detector array of FIG. 2.

FIGS. 2 and 3 schematically illustrate a bump 44 on semiconductor wafer 22, under inspection in system 20 by an array of detectors 32, in accordance with an embodiment of the present invention. FIG. 2 is a sectional view, while FIG. 3 is a top view. In this example, a Cu pillar 40 extends through a layer 42, such as an insulating layer, that is formed on the wafer. Bump 44 comprises Sn, which is formed as a cap over pillar 40. The bump contains a void 46, typically as the result of a process defect. Although the void is shown, for the sake of simplicity, as having a spherical form, the methods of void detection that are described herein may similarly be applied to voids of substantially any shape.

Detectors 32 are arrayed around bump at equal elevations (about 45° in this example) and at azimuthal angles 90° apart. For convenience in the description that follows, the detectors are labeled, A, B, C and D, with detectors A and B forming one pair 180° apart in azimuth, and C and D forming another such pair. In response to an excitation beam 48 impinging on pillar 40 through cap 44, detectors 32 receive fluorescence beams 50, in characteristic Cu X-ray emission lines, which likewise pass through and are attenuated by cap 44. In addition, detectors 32 receive fluorescence emitted from cap 44 in characteristic Sn X-ray emission lines. (Because of strong self-absorption, the detected SnL fluorescent X-rays are typically emitted only from the outer shell of cap, to a depth of about 2 μm.) Analyzer and processor 36 may detect, for example, the intensities of the strong CuKα emission line at 8.041 keV and the SnL emission lines at 3.444 and 3.662 keV as indicators of the respective signal strengths of fluorescence from pillar 40 and cap 44, respectively.

The Sn in cap 44 absorbs, and thus attenuates, the CuKα X-rays in fluorescence beams 50, and the CuKα signals output by detectors 32 are thus reduced in proportion to the path length of beams 50 through cap 44. In the absence of defects in the cap, the attenuation of all four of beams 50 will be equal, and thus so will the signals. Within void 46, however, the CuKα X-rays are not attenuated. Therefore, in the example shown in FIGS. 2 and 3, detector A will output a stronger CuKα signal than detector B. Roughly speaking, the diameter of void 46 can be derived from the normalized difference of the respective CuKα signals, i.e., $\Delta^{Cu}{}_{AB} = (I_A - I_B)/(I_A + I_B)$. This formula is based on a simplified model, assuming the void is located on the axis of one of beams 50, occupying the entire beam width, with uniform flux density of the beam over the void.

In actual practice, detection is complicated by a number of geometrical and optical factors. On the one hand, because of the narrow irradiating beam and limited detection angles of detectors 32, voids in some areas of bump 44 may not be detected. For example, as seen in FIG. 2, the detectors may miss or underestimate the size of voids at low elevation angles, near the edges of the bump; while voids near the center of the bump, which fall on the axis of the irradiating beam, may simply cause an increase in the signals received by all the detectors. By the same token, as seen in FIG. 3, voids at azimuthal angles falling between the axes of beams 50, as defined by the locations of detectors 32, may similarly be missed or underestimated.

These possible areas of insensitivity may be overcome by repeating the fluorescence measurements at different angles and/or at different beam displacements. For example, for some (or all) bumps, wafer 22 may be rotated on stage 38 by 45° and the measurement repeated. Similarly, the detector elevations angles may be changed (or the wafer may be tilted). Additionally or alternatively, the wafer may be translated by stage 38 in small steps to adjust the location of the irradiating beam relative to the bump.

In addition, the simplified formula presented above does not take into account that the void diameter d is typically less than the diameter s of the irradiating beam. As a result, only a part of the fluorescence emitted from pillar 40 actually passes through void 46 (and thus undergoes less attenuation), while the remainder of the fluorescence passes entirely through the absorbing material of bump 44 around the void. These geometrical factors are taken into account by the following corrected formula, which relates the diameter of a single void in a hemispherical bump to the normalized difference of the respective CuKα signals measured by detectors A and B:

$$\Delta^{Cu}_{AB} = \frac{I^A_{CuK\alpha} - I^B_{CuK\alpha}}{I^A_{CuK\alpha} + I^B_{CUK\alpha}} = \frac{\left(\frac{d}{s}\right)^2 \cdot (e^{d \cdot \mu_2} - 1)}{\left(\frac{d}{s}\right)^2 \cdot (e^{d \cdot \mu_2} - 1) + 2}$$

Here $\mu_2$ is the absorption coefficient of the CuKα line in Sn.

Figure 4:
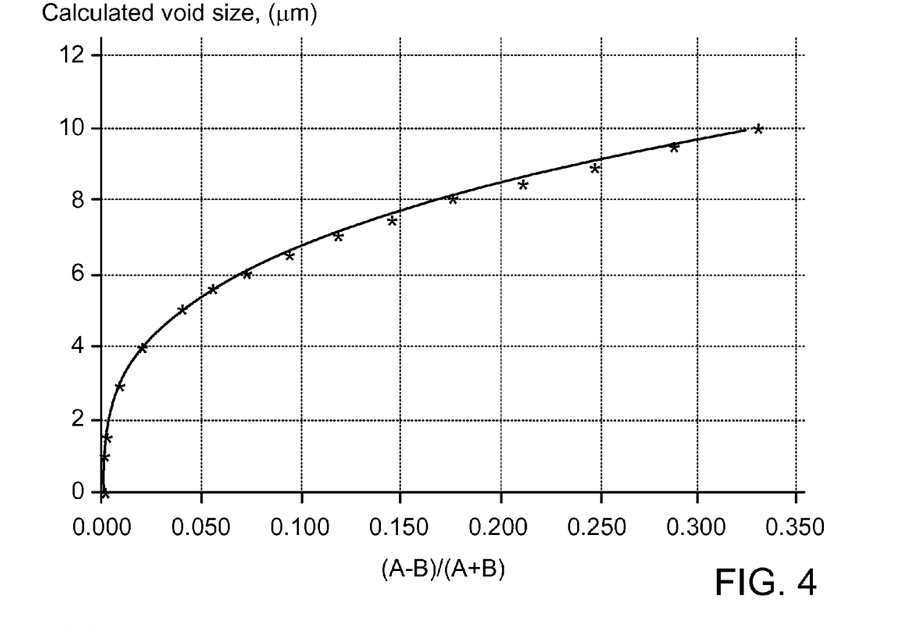
FIG. 4 is a schematic plot of XRF signal variations due to voids in a bump on a semiconductor wafer, in accordance with an embodiment of the present invention.

FIG. 4 is a schematic plot of void size (diameter) as a function of differences in XRF signals output by opposing detectors 32, in accordance with an embodiment of the present invention. (The normalized ratio $\Delta^{Cu}{}_{AB}$ is abbreviated as (A−B)/(A+B) in the label of the horizontal axis.) For large voids, the normalized ratio gives an accurate, reliable measure of the void size. The detection limit for small void sizes depends on the strength of the XRF signals and the integration time. For example, when detectors 32 output signal levels of 10,000 counts/sec for incident CuKα photons, voids of size 4 μm or greater can be detected with integration time of 1 sec per measurement. Smaller voids can be detected by increasing the integration time. The appropriate integration time in each case can be chosen as a tradeoff between void detection threshold and throughput.

Figure 5:
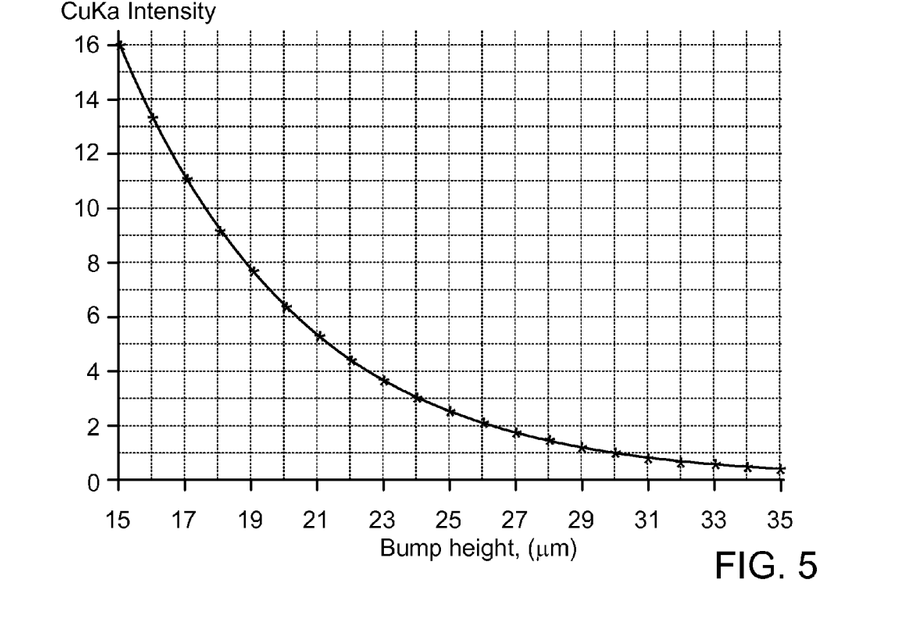
FIG. 5 is a schematic plot of the variation, as a function of the height of a bump on a semiconductor wafer, of an XRF signal arising from an underlying pillar, in accordance with an embodiment of the present invention.

FIG. 5 is a schematic plot of XRF signal variations as a function of the height of bump 44, in accordance with an embodiment of the present invention. The vertical axis represents the measured CuKα intensity averaged over all four of detectors 32, normalized to the intensity received from a bump of height 30 μm. This intensity varies exponentially with the bump height h, as given by the formula:

$$I_{CuK\alpha} \sim I_{CuK\alpha,pillar} \cdot e^{-(\mu_1 + \mu_2) \cdot h}$$

Here $\mu_1$ is the absorption coefficient of Sn with respect to the irradiating beam, while $\mu_2$ is the absorption coefficient for CuKα. $I_{CuK\alpha,pillar}$ is the baseline emission intensity of pillar 40 in the absence of any overlying bump. This simple expression approximates the absorption of the polychromatic X-ray irradiation by means of the absorption coefficient $\mu_1$ for an effective (monochromatic) irradiation energy, for example, about 1.5 times the energy of the CuK-edge.

The above relation can be used to estimate the bump height based on the average (or sum) of the detector signals. By itself, the formula may be used to detect variations in height between different bumps. To estimate the absolute bump height, processor 36 may calibrate the detector signals relative to a bump of known height or possibly relative to a pillar with no overlying bump. It can be shown that the measured CuKα intensity is insensitive to pillar height, so that the pillar may regarded for the present purposes as an X-ray source of infinite depth.

Figure 6:
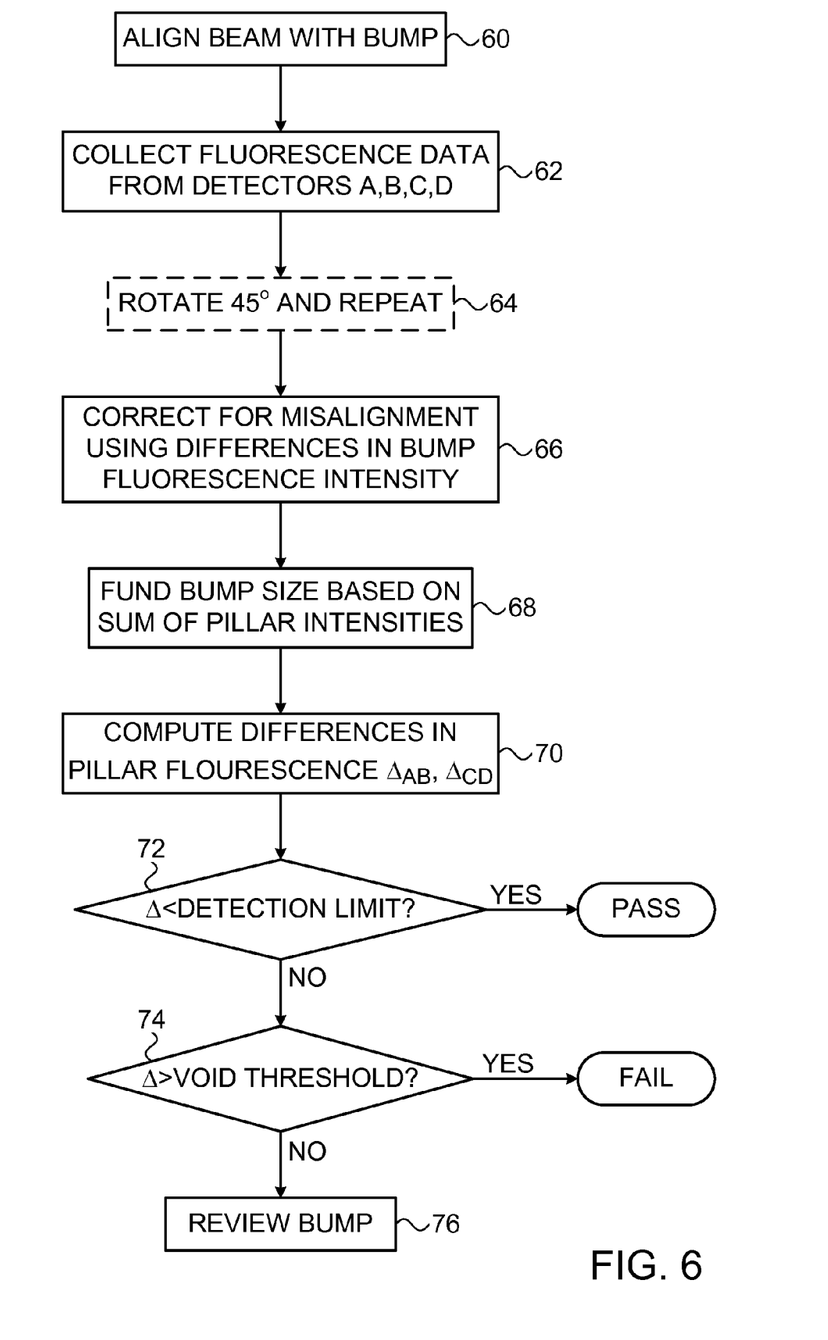
FIG. 6 is a flow chart that schematically illustrates a method for X-ray inspection of bumps on a semiconductor wafer, in accordance with an embodiment of the present invention.

FIG. 6 is a flow chart that schematically illustrates a method for X-ray inspection of bumps on wafer 22, in accordance with an embodiment of the present invention. To begin inspection of a given bump 44, the focused excitation beam from source 24 is aligned with the bump, at an alignment step 60. This preliminary alignment may be performed by methods known in the art, such as using an optical microscope or a pre-registered map of the wafer. (Any residual misalignment may subsequently be corrected using the actual X-ray fluorescence, as explained below.) Source 24 is activated, and detectors 32 detect fluorescent X-rays and output respective detector signals accordingly, at a data collection step 62. Analyzer 34 separates out the X-ray measurements by photon energy, and processor 36 counts the X-ray photons received by each of detectors 32 (A, B, C and D) in each fluorescence line of interest, such as the CuKα and SnL lines mentioned above.

As noted earlier, the detection geometry shown in FIGS. 1-3 may fail to detect voids in certain areas of bump 44 or may lead to underestimation of void sizes in these areas. For more thorough inspection, a larger number of detectors may be used, giving denser angular coverage. Alternatively or additionally, stage 38 may rotate wafer 22 in place, by 45° or by some other desired angle, and the measurement of step 62 may then be repeated, at a rotated detection step 64. As a further alternative, this sort of repeated measurement may be performed at a later stage, and may be limited to certain bumps that are found to be suspect based on the initial measurement stage.

A further possible source of error in the detection and measurement of voids in bump 44 is misalignment between the excitation beam and the bump: If the excitation beam is off-center relative to the bump, the void size given by the above formulas may be erroneous. Beam centering can be corrected, however, by measuring fluorescent emission from the material of the bump itself, such as the SnL emission lines mentioned above, at a misalignment correction step 66. When the excitation beam is perfectly aligned with the bump, all of detectors 32 will receive roughly the same number of SnL fluorescent photons. Misalignment will result in a difference between the SnL signals output by an opposing pair of the detectors (such as detectors A and B), and this difference grows linearly with the displacement of the beam relative to the bump center.

Thus, at step 66, processor 36 measures the difference in bump (SnL) fluorescence signals between the detector pairs A/B and C/D and applies the difference in correcting for misalignment. The processor may, for example, instruct stage 38 to translate wafer 22 slightly in order to improve the centering of the excitation beam on bump 44. Alternatively or additionally, the processor may apply a mathematical correction to the estimated size of any voids found in the bump in order to compensate for the error introduced by misalignment. As a further alternative, to increase throughput, these corrections may be applied only in a later stage, when certain bumps are chosen for more thorough review.

Analyzer 34 processes the signals from detectors 32 to determine the intensity of one or more pillar fluorescence lines, such as the CuKα line, and processor applies this information in estimating bump parameters, as described above. Processor 36 computes a sum of the CuKα measurements and uses this sum to estimate the bump size (specifically the bump height), as illustrated in FIG. 5, at a size estimation step 68. Processor 36 takes the differences between the CuKα measurements of the opposing pairs of detectors, $\Delta^{Cu}_{AB}$ and $\Delta^{Cu}_{CD}$, and uses these difference in detecting voids, and possibly other defects, in the bump, at a difference measurement step 70.

For the purposes of void assessment, an operator of system 20 may set certain detection limits and thresholds. For example, the operator may decide that only voids greater than some minimum size are of interest or, concomitantly, that at the given signal levels and integration times, voids smaller than a given minimum size will give differences $\Delta^{Cu}_{AB}$ and $\Delta^{Cu}_{CD}$ that are indistinguishable from the detection noise level. Thus, the operator sets a detection limit on $\Delta^{cu}_{AB}$ and $\Delta^{Cu}_{DD}$, to which processor 36 compares the measured difference values, at a limit step 72. When the measured differences are less than the detection limit for a given bump, processor 36 indicates that the bump has passed void inspection and has no voids of significance.

Similarly, to avoid measurement uncertainty and false positives, the operator may set a threshold, above which there is a high level of certainty that the bump in question contains a void. When processor 36 finds that at least one of the differences $\Delta^{Cu}_{AB}$ and $\Delta^{Cu}_{CD}$ is greater than this threshold, it labels the bump as defective, at a threshold checking step 74.

If the signal differences $\Delta^{Cu}_{AB}$ and $\Delta^{Cu}_{CD}$ for a given bump are significant, i.e., greater than the detection limit, but are still below the threshold for certain detection of a void, processor 36 may flag the bump location for further review, at a review step 76. At this step, the excitation beam may, for example, be scanned across the bump in small increments, in order to ensure proper alignment of the beam with the bump and increase the probability of correct detection of a void. This sort of scan may be carried out along multiple lines passing through the bump. Additionally or alternatively, the wafer may be rotated so that detectors 32 capture fluorescence from the bump at multiple different angles, as explained above. The review at step 76 can be time-consuming, but it is typically performed on only a small fraction of the bumps under inspection and is useful in resolving uncertain measurements.

The formulas presented above assume bump 44 and void 46 to have certain idealized, well-defined geometrical characteristics. Variations from these idealized characteristics, as may occur in actual wafer fabrication, will detract from the accuracy of void dimension measurements that use the above formulas, but system 20 will still identify the voids, regardless of shape, and will thus indicate the need to correct and adjust the process of bump production. The above formulas may be modified (at the expense of greater complication) to allow for arbitrary shapes of both the bump and the void, as will be apparent to those skilled in the art after reading the present description.

The techniques described above are likewise useful in detecting volumes of contaminants enclosed in bumps on a wafer (and such volumes, for purposes of the present invention, may similarly be regarded as a type of "voids"). Although the embodiments described above relate specifically to particular types of metal structures on a semiconductor wafer, the principles of these embodiments may similarly be applied to other sorts of structures in which a cap containing one element is formed over a volume of a different element.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Inspection apparatus, comprising:
   an X-ray source, which is configured to emit a focused beam of X-rays toward a semiconductor wafer;
   a motion stage, which is configured to align a location of the focused beam relative to the wafer so that the beam is focused on a feature formed on the wafer, the feature including a volume containing a first material and a cap made of a second material, different from the first material, that is formed over the volume;
   an array of detectors, comprising first and second detectors positioned at opposing azimuthal angles relative to the feature, which are configured to detect X-ray fluorescent photons that are emitted by the first material in response to the irradiating beam and pass through the cap before striking the detectors, and to output respective first and second signals in response to the detected X-ray fluorescent photons; and processing circuitry, which is coupled to measure and normalize a difference between first and second signals and to identify, in response to the normalized difference between the signals, a void enclosed inside the cap.

2. The apparatus according to claim 1, wherein the array of detectors further comprises third and fourth detectors, which are positioned at mutually-opposing azimuthal angles between the first and second detectors and are configured to output respective third and fourth signals in response to the X-ray fluorescent photons, and wherein the processing circuitry is coupled to measure a further difference between the third and fourth signals in order to identify the void.

3. The apparatus according to claim 1, wherein the processing circuitry is configured to measure an attenuation by the second material of the X-rays emitted in a characteristic fluorescence line of the first material.

4. The apparatus according to claim 3, wherein the processing circuitry is configured to estimate a size of the cap responsively to the attenuation.

5. The apparatus according to claim 1, wherein the detectors and configured to detect further X-rays emitted from the cap in response to the irradiating beam in a characteristic fluorescence line of the second material, and wherein the processing circuitry is configured to assess a misalignment of the array relative to the feature based on a difference between the X-rays in the characteristic fluorescence line detected at the different angles, and to correct for the misalignment in detection of the X-ray fluorescent photons.

6. The apparatus according to claim 5, wherein each of the detectors is configured to simultaneously detect the X-ray fluorescent photons that are emitted by the first material and the further X-rays emitted from the cap.

7. The apparatus according to claim 3, wherein the volume comprises a pillar containing a first metallic element, and the cap includes a second metallic element, configured to serve as an electrical contact for the pillar.

8. A method for inspection, comprising:
irradiating, with a focused beam, a semiconductor wafer;
aligning the beam with the wafer so that the beam is focused on a feature formed on the wafer, the feature including a volume containing a first material and a cap made of a second material, different from the first material, that is formed over the volume;

detecting, using one or more detectors positioned at opposing, first and second azimuthal angles relative to the feature, X-ray fluorescent photons that are emitted by the first material in response to the irradiating beam and pass through the cap before striking the detectors; and measuring and normalizing a difference between first and second signals output by the one or more detectors at the first and second azimuthal angles, respectively, in response to the detected X-ray fluorescent photons, and identifying, in response to the normalized difference between the signals, a void enclosed inside the cap.

9. The method according to claim 8, and comprising:
detecting, using the one or more detectors, the X-ray fluorescent photons that are emitted by the first material in response to the irradiating beam and pass through the cap at mutually-opposing third and fourth azimuthal angles, between the first and second azimuthal angles; and measuring a further difference between third and fourth signals output by the one or more detectors at the third and fourth azimuthal angles, respectively, in response to the detected X-ray fluorescent photons in order to identify the void.

10. The method according to claim 8, and comprising measuring an attenuation by the second material of the X-rays emitted in a characteristic fluorescence line of the first material.

11. The method according to claim 10, wherein measuring the attenuation comprises estimating a size of the cap responsively to the attenuation.

12. The method according to claim 8, and comprising detecting, using an array of the detectors, further X-rays emitted from the cap in response to the irradiating beam in a characteristic fluorescence line of the second material, and assessing a misalignment of the array relative to the feature based on a difference between the X-rays in the characteristic fluorescence line detected at the different angles, and wherein detecting the X-ray fluorescent photons comprises correcting for the misalignment in detection of the X-ray fluorescent photons.

13. The method according to claim 12, wherein detecting the further X-rays comprises simultaneously detecting, in each of the detectors in the array, the X-ray fluorescent photons that are emitted by the first material and the further X-rays emitted from the cap.

14. The method according to claim 8, wherein the volume comprises a pillar containing a first metallic element, and the cap includes a second metallic element, configured to serve as an electrical contact for the pillar.

\* \* \* \* \*